United States Patent
Das et al.

(10) Patent No.: US 10,833,657 B2
(45) Date of Patent: Nov. 10, 2020

(54) VARIABLE OUTPUT RESISTANCE IN A PLAYBACK PATH WITH CLOSED-LOOP PULSE-WIDTH MODULATION DRIVER

(71) Applicant: Cirrus Logic International Semiconductor Ltd., Edinburgh (GB)

(72) Inventors: Tejasvi Das, Austin, TX (US); Johann G. Gaboriau, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/181,792

(22) Filed: Nov. 6, 2018

(65) Prior Publication Data

US 2020/0044628 A1     Feb. 6, 2020

Related U.S. Application Data

(60) Provisional application No. 62/714,812, filed on Aug. 6, 2018.

(51) Int. Cl.

| H03K 3/017 | (2006.01) |
|---|---|
| H03K 3/011 | (2006.01) |
| H03G 3/30 | (2006.01) |
| H04R 3/00 | (2006.01) |
| H03F 3/183 | (2006.01) |

(52) U.S. Cl.
CPC ............ *H03K 3/017* (2013.01); *H03F 3/183* (2013.01); *H03G 3/3005* (2013.01); *H03K 3/011* (2013.01); *H04R 3/00* (2013.01); *H03F 2200/03* (2013.01); *H03G 2201/103* (2013.01)

(58) Field of Classification Search
CPC ............ H02M 3/156; H02M 3/33507; H02M 3/33523; H02M 1/32; H05B 33/0815; H03K 3/017; H03K 3/011; H03K 7/08; H03G 3/3005; H03G 2201/103; H04R 3/00; H04R 2420/03; H03F 3/183; H03F 3/181; H03F 3/217; H03F 2200/03; H03F 2200/387; H03F 1/56

See application file for complete search history.

(56) References Cited

U.S. PATENT DOCUMENTS

| 5,541,828 | A | * | 7/1996 | Rozman | ................ | H02M 1/40 |
| | | | | | | 323/267 |
| 6,211,579 | B1 | * | 4/2001 | Blair | ................ | H02M 3/33561 |
| | | | | | | 307/18 |

(Continued)

OTHER PUBLICATIONS

International Search Report and Written Opinion of the International Searching Authority, International Application No. PCT/US2019/045113, dated Oct. 24, 2019.

*Primary Examiner* — Sibin Chen
(74) *Attorney, Agent, or Firm* — Jackson Walker L.L.P.

(57) ABSTRACT

In accordance with embodiments of the present disclosure, an apparatus may include a signal path comprising a closed-loop analog pulse width modulator having a forward signal path and a feedback path, a variable resistor coupled to an output of the closed-loop analog pulse width modulator, and a control circuit configured to modify the variable resistor in order to modify an output impedance outside of the feedback path of the closed-loop analog pulse width modulator responsive to a condition for switching between a high output impedance mode and a low output impedance mode of the closed-loop analog pulse width modulator or vice versa.

24 Claims, 3 Drawing Sheets

(56) References Cited

U.S. PATENT DOCUMENTS

| | | | |
|---|---|---|---|
| 7,312,654 B2* | 12/2007 | Roeckner | H03F 1/305 |
| | | | 330/10 |
| 2006/0092063 A1* | 5/2006 | Ido | H03F 3/217 |
| | | | 341/144 |
| 2014/0266433 A1 | 9/2014 | Nobbe et al. | |
| 2015/0091649 A1 | 4/2015 | Jeon et al. | |
| 2017/0177019 A1* | 6/2017 | Wu | G05F 3/26 |
| 2018/0212570 A1 | 7/2018 | Zhu et al. | |

* cited by examiner

US 10,833,657 B2

VARIABLE OUTPUT RESISTANCE IN A PLAYBACK PATH WITH CLOSED-LOOP PULSE-WIDTH MODULATION DRIVER

RELATED APPLICATION

The present disclosure claims priority to U.S. Provisional Patent Application Ser. No. 62/714,812, filed Aug. 6, 2018, which is incorporated by reference herein in its entirety.

FIELD OF DISCLOSURE

The present disclosure relates in general to circuits for audio and haptic devices, including without limitation personal audio devices, such as wireless telephones and media players, or devices comprising a haptic module.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a closed-loop pulse-width modulation (PWM) amplifier. A closed-loop PWM amplifier may be chosen in order to provide an accurate load voltage with desirable Total Harmonic Distortion (THD) and Power Supply Rejection Ratio (PSRR). A closed-loop PWM amplifier typically takes an analog voltage input and a sensed feedback voltage signal which are fed through a closed-loop analog PWM modulator to drive voltage on a speaker load.

SUMMARY

In accordance with the teachings of the present disclosure, one or more disadvantages and problems associated with existing approaches to processing signals with an amplifier may be reduced or eliminated.

In accordance with embodiments of the present disclosure, an apparatus may include a signal path comprising a closed-loop analog pulse width modulator having a forward signal path and a feedback path, a variable resistor coupled to an output of the closed-loop analog pulse width modulator, and a control circuit configured to modify the variable resistor in order to modify an output impedance outside of the feedback path of the closed-loop analog PWM responsive to a condition for switching between a high output impedance mode and a low output impedance mode of the closed-loop analog pulse width modulator or vice versa.

In accordance with these and other embodiments of the present disclosure, a method may include, in a system comprising a signal path comprising a closed-loop analog pulse width modulator having a forward signal path and a feedback path and a variable resistor coupled to an output of the closed-loop analog pulse width modulator, modifying the variable resistor in order to modify an output impedance outside of the feedback path of the closed-loop analog PWM responsive to a condition for switching between a high output impedance mode and a low output impedance mode of the closed-loop analog pulse width modulator or vice versa.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
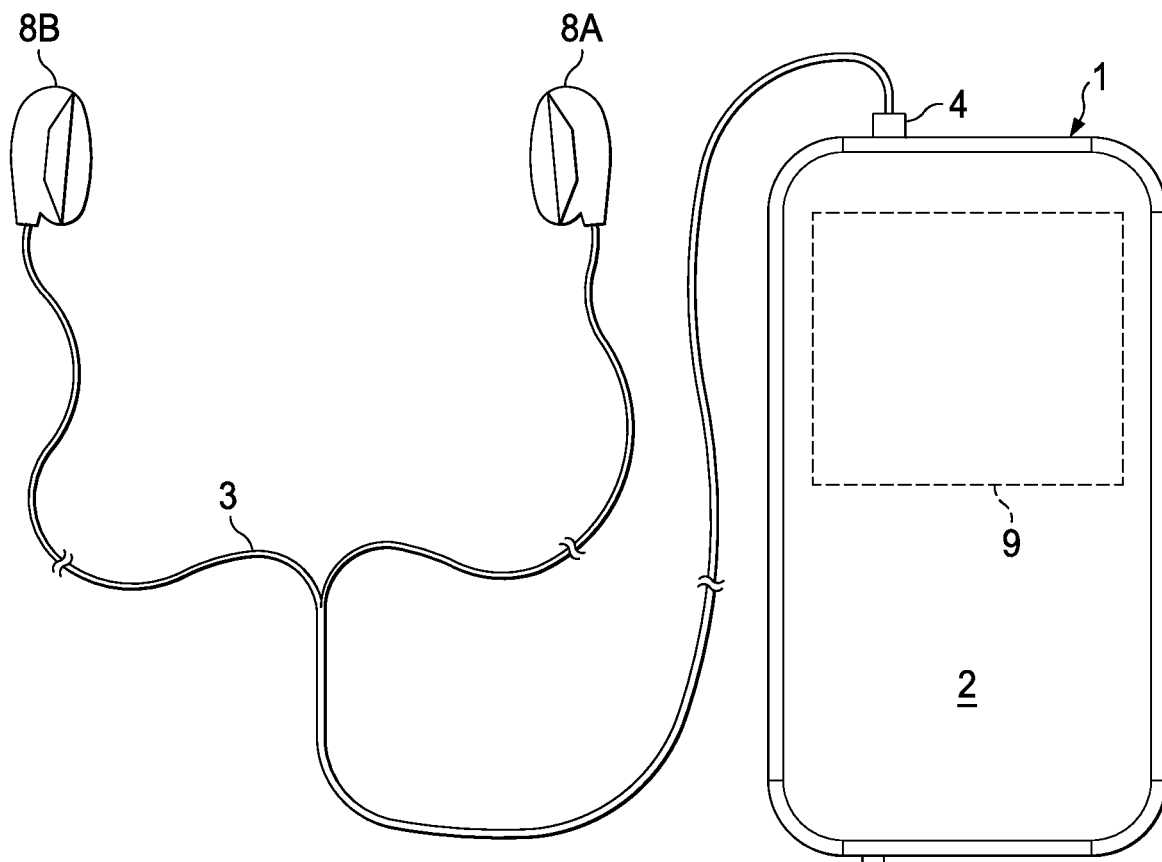
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Alternatively, in some embodiments, headset 3 may be wirelessly coupled (such as, for example, through a Bluetooth® connection) to personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2:
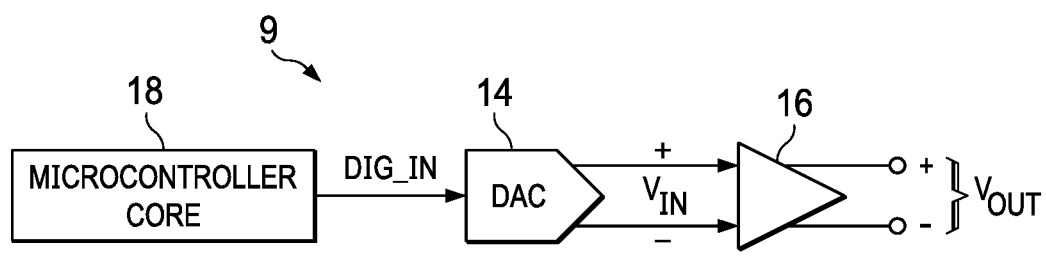
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 (e.g., a digital signal processor or "DSP")

may supply a digital audio input signal DIG_IN to a digital-to-analog converter (DAC) 14, which may convert the digital audio input signal to an analog input signal $V_{IN}$. DAC 14 may supply analog input signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

The foregoing contemplates that an audio IC 9 including an amplifier 16 may reside within personal audio device 1. However, in some embodiments, such as when headset 3 is a wireless headset, amplifier 16 and one or more other components of audio IC 9 may reside within headset 3.

Figure 3:
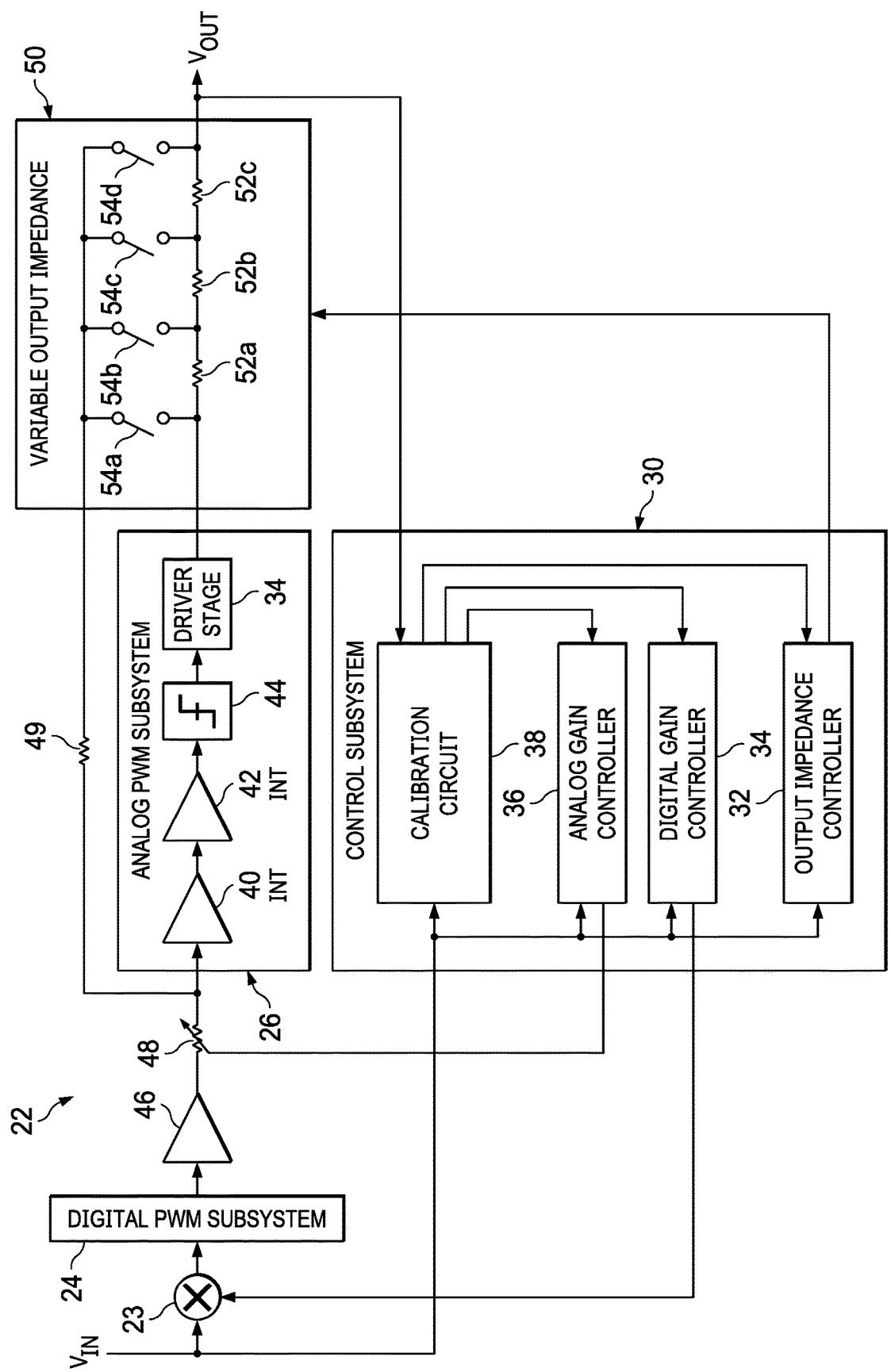
FIG. 3 is a block diagram of selected components of an example pulse width modulation amplifier, in accordance with embodiments of the present disclosure.

FIG. 3 is a block diagram of selected components of an example pulse width modulation (PWM) amplifier 22, in accordance with embodiments of the present disclosure. In some embodiments, example pulse width modulation amplifier 22 may be used to implement all or a portion of amplifier 16 of FIG. 2. As shown in FIG. 3, example pulse width modulation amplifier 22 may include a digital gain element 23, a digital PWM subsystem 24, a buffer 46, an analog PWM subsystem 26, an analog PWM input resistor 48, an analog PWM feedback resistor 49, a variable output impedance 50, and a control subsystem 30. As shown, PWM amplifier 22 may operate as an analog-closed loop amplifier, utilizing the signal path formed by digital gain element 23, digital PWM subsystem 24, buffer 46, analog PWM input resistor 48, analog PWM subsystem 26, and variable output impedance 50.

Digital gain element 23 may comprise any system, device, or apparatus configured to have a variable digital gain and apply such variable digital gain to an input signal (e.g., input signal $V_{IN}$). As shown in FIG. 3 and described in greater detail below, the variable digital gain of digital gain element 23 may be controlled by one or more control signals generated by control subsystem 30.

Digital PWM subsystem 24 may comprise any suitable system, device, or apparatus for converting input signal $V_{IN}$ into an equivalent PWM signal in the digital signal domain. Buffer 46 may be interfaced between digital PWM subsystem 24 and analog PWM subsystem 26 to buffer a digital PWM signal generated by digital PWM subsystem 24 to the input of analog PWM subsystem 26. In some embodiments, buffer 46 may comprise a digital-to-analog converter configured to convert a digital PWM signal received at an input of buffer 46 to an equivalent analog PWM signal at the output of buffer 46.

As shown in FIG. 3, input resistor 48 may be coupled between the output of buffer 46 and an input of analog PWM subsystem 26. Also as shown in FIG. 3 and described in greater detail below, input resistor 48 may have a variable resistance which may be controlled by one or more control signals generated by control subsystem 30. Further as depicted in FIG. 3, feedback resistor 49 may be coupled between the input of analog PWM subsystem 26 and variable output impedance 50.

Analog PWM subsystem 26 may include a first-stage integrator 40 followed by one or more additional stage integrators 42, which are in turn followed by a quantizer 44 that may generate an analog PWM signal to a driver stage 34 of analog PWM subsystem 26. First-stage integrator 40 may integrate an error between an input signal generated by buffer 46 and a feedback signal fed back through feedback resistor 49, wherein such feedback signal may be indicative of output signal $V_{OUT}$. Integrator(s) 42 may further integrate the error consistent with the design of analog PWM subsystem 26. Quantizer 44 may comprise any system, device, or apparatus configured to quantize a signal (e.g., the signal output by integrators 42) to generate an equivalent analog PWM signal.

Driver stage 34 may comprise any system, device, or apparatus configured to receive a quantized analog PWM signal (e.g., as generated by quantizer 44) and drive an output signal to variable output impedance 50 as described in greater detail below and to a load coupled to an output of variable output impedance 50. In some embodiments, such load may include a transducer (e.g., an audio transducer, haptic transducer, or other transducer). Accordingly, driver stage 34 may comprise a plurality of output switches configured to generate output signal $V_{OUT}$ from an analog modulated signal generated by quantizer 44.

Variable output impedance 50 may comprise a plurality of series impedance elements 52 (e.g., impedance elements 52a, 52b, 52c) and a plurality of control switches 54 (e.g., control switches 54a, 54b, 54c, 54d). As described in greater detail below, in operation, one of control switches 54 may be activated (e.g., closed, on, enabled) by one or more control signals received from control subsystem 30 while the other of control switches 54 may be disabled (e.g., open, off, disabled) by one or more control signals received from control subsystem 30, such that none, a portion, or all of the overall impedance of impedance elements 52 is within a feedback loop of analog PWM subsystem 26 running from the output of driver stage 34 to the input of analog PWM subsystem 26, and the remainder of impedance elements 52 is outside of such feedback loop. For the purposes of clarity and exposition, FIG. 3 depicts only four control switches 54 and three impedance elements 52. However, embodiments of the present disclosure may include any suitable number of control switches 54 and impedance elements 52. Also, the technique shown in FIG. 3 for modifying the amount of impedance within the feedback path and outside of the feedback path is merely illustrative, and any other suitable technique may be employed.

Those of skill in the art will recognize that modifying variable output impedance 50 as described above may have the effect of modifying the path gain of the signal path of PWM amplifier 22. For example, increasing impedance within the feedback path of analog PWM subsystem 26 may decrease the path gain while decreasing impedance within the feedback path of analog PWM subsystem 26 may increase the path gain. Accordingly, as described in greater detail below, to maintain a constant path gain throughout the signal path, control subsystem 30 may control one or both of digital gain element 23 and input resistor 48 to compensate for the change in path gain caused by modifying variable output impedance 50.

Control subsystem 30 may include any system, device, or apparatus configured to receive an input signal (e.g., input signal $V_{IN}$) and based on one or more characteristics of the input signal, control one or more of variable output impedance 50, the variable digital gain of digital gain element 23, and/or the variable impedance of input resistor 48. Such one or more characteristics of the input signal may comprise one or more of a magnitude of the input signal, a signal frequency of the input signal, and a signal ramp rate (e.g., a rate of increase or decrease of the magnitude) of the input signal.

For example, control subsystem 30 may include an output impedance controller 32 configured to receive an input signal (e.g., input signal $V_{IN}$) and based on one or more characteristics of the input signal, control the impedance of variable output impedance 50. In some embodiments, output impedance controller 32 together with variable output impedance 50 may operate in a plurality of output impedance modes including a high output impedance mode and a low output impedance mode of the closed-loop analog pulse width modulator. In such embodiments, when switching from the high output impedance mode to the low output impedance mode (e.g., in response to the input signal increasing from below a threshold magnitude to above the threshold magnitude), control subsystem 30 may control the various control switches 54 to increase a first amount of impedance of variable output impedance 50 within the feedback path of analog PWM subsystem 26 and decrease a second amount of impedance of variable output impedance 50 outside the feedback path of analog PWM subsystem 26; and, when switching from the low output impedance mode to the high output impedance mode (e.g., in response to the input signal decreasing from above a threshold magnitude to below the threshold magnitude), control subsystem 30 may control the various control switches 54 to decrease the first amount of impedance of variable output impedance 50 within the feedback path of analog PWM subsystem 26 and increase the second amount of impedance of variable output impedance 50 outside the feedback path of analog PWM subsystem 26.

In order to reduce audio artifacts (e.g., audible pops and clicks) associated in changing between the high impedance mode and the low impedance mode (or vice versa), output impedance controller 54 may transition the output impedance continuously or in a series of steps between the first impedance and the second impedance (or vice versa).

As another example, control subsystem 30 may include a digital gain controller 34 configured to receive an input signal (e.g., input signal $V_{IN}$) and based on one or more characteristics of the input signal, control the variable digital gain of digital gain element 23. In embodiments described above in which output impedance controller 32 together with variable output impedance 50 may operate in a plurality of output impedance modes including the high impedance mode and the low impedance mode, contemporaneously with transitioning the output impedance between the high impedance mode and low impedance mode (or vice versa), digital gain controller 34 may transition the variable digital gain of digital gain element 23 continuously or in a series of steps such that an overall path gain of the signal path of PWM amplifier 22 remains substantially constant during the transitioning of variable output impedance 50 between the high impedance mode and low impedance mode (or vice versa).

As a further example, control subsystem 30 may include an analog gain controller 36 configured to receive an input signal (e.g., input signal $V_{IN}$) and based on one or more characteristics of the input signal, control the impedance of input resistor 48. In embodiments described above in which output impedance controller 32 together with variable output impedance 50 may operate in a plurality of output impedance modes including the high impedance mode and the low impedance mode, contemporaneously with transitioning the output impedance between the high impedance mode and low impedance mode (or vice versa), analog gain controller 36 may transition the variable impedance of input resistor 48 continuously or in a series of steps such that an overall path gain of the signal path of PWM amplifier 22 remains substantially constant during the transitioning of variable output impedance 50 between the high impedance mode and low impedance mode (or vice versa).

Although the foregoing contemplates using both control of digital gain element 23 and control of input resistor 48 to compensate for path gain changes caused as a result of modification to variable output impedance 50, maintenance of a contact path gain in response to modification to variable output impedance 50 may be performed solely by control of digital gain element 23 (in which case the impedance of input resistor 48 may be constant), solely by control of input resistance 48 (in which case digital gain element 23 may not be present), or by control of both digital gain element 23 and input resistance 48.

As shown in FIG. 3, control subsystem 30 may also include a calibration circuit 38. Calibration circuit 38 may include any system, device, or apparatus configured to receive an input signal (e.g., input signal $V_{IN}$) and an output signal (e.g., output signal $V_{OUT}$) and based on characteristics of the input signal and output signal, calibrate the variable digital gain of digital gain element 23, the variable impedance of input resistor 48, and/or the impedance of variable output impedance 50 (which, as stated above, controls an analog gain of the signal path of PWM amplifier 22), in order to set an overall path gain of the signal path of PWM amplifier 22 to a desired gain (e.g., in some embodiments, a unity gain). In some embodiments, calibration circuit 38 may be present on the same integrated circuit as the signal path of PWM amplifier 22, such that calibration circuit 38 may experience the same conditions (e.g., external conditions such as temperature, pressure, etc.) as the signal path. In some embodiments, calibration circuit 38 may perform such calibration at product test of PWM amplifier 22 prior to end use of PWM amplifier (e.g., by using a pilot tone for the input signal and comparing it with the output signal generated from the pilot tone). In these and other embodiments, calibration circuit 38 may perform such calibration during real-time operation of PWM amplifier 22 during its end use (e.g., use in an audio system, haptic system, or other system), such that calibration circuit 38 implements a calibration loop. When calibration is performed in real-time operation of PWM amplifier 22, such calibration may compensate for variation in variable output resistance 50 and/or impedance of input resistor 48 due to changes in temperature.

Figure 4:
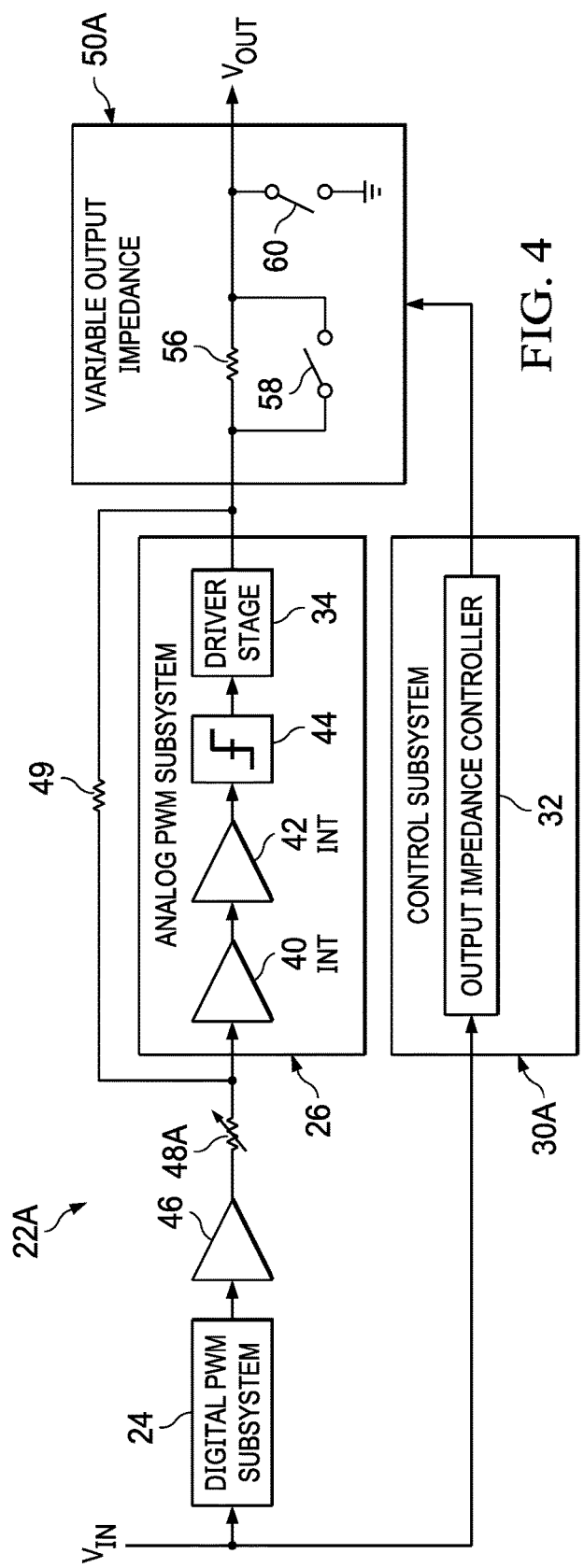
FIG. 4 is a block diagram of selected components of another example pulse width modulation amplifier, in accordance with embodiments of the present disclosure.

FIG. 4 is a block diagram of selected components of an example PWM amplifier 22A, in accordance with embodiments of the present disclosure. In some embodiments, example PWM amplifier 22A may be used to implement all or a portion of amplifier 16 of FIG. 2. PWM amplifier 22A as shown in FIG. 4 may be similar in many respects to PWM amplifier 22 shown in FIG. 3. Accordingly, only the material differences between PWM amplifier 22 and PWM amplifier 22A are discussed below. For example, digital gain element 23 of PWM amplifier 22 is absent in PWM amplifier 22A. As another example, input resistor 48 of PWM amplifier 22 having variable impedance is replaced in PWM amplifier 22A with an input resistor 48A having a fixed impedance. In addition, because of the lack of digital gain element 23 and the lack of variable impedance for input resistor 48A, control subsystem 30A may not include digital gain controller 34 or analog gain controller 36 present in control subsystem 30. Also, while PWM amplifier 22A may perform some calibration similar to that performed by calibration circuit 38 of PWM amplifier 22, for purposes of clarity and exposition, calibration circuit 38 is left out of PWM amplifier 22A and FIG. 4.

Another key difference between PWM amplifier 22 and PWM amplifier 22A is that variable output impedance 50 of PWM amplifier 22 is replaced with variable output impedance 50A of PWM amplifier 22A. As shown in FIG. 4, variable output impedance 50A may comprise an impedance element 56 coupled between the output of analog PWM subsystem 26 and the output of PWM amplifier 22A, a bypass switch 58 in parallel with impedance element 56, and a ground switch 60 between the output of analog PWM subsystem 26 and a ground voltage.

In operation, control subsystem 30A may receive an input signal (e.g., input signal $V_{IN}$) and based on one or more characteristics of the input signal, control variable output impedance 50A. Such one or more characteristics of the input signal comprise one or more of a magnitude of the input signal, a signal frequency of the input signal, and a signal ramp rate (e.g., a rate of increase or decrease of the magnitude) of the input signal.

For example, control subsystem 30A may include an output impedance controller 32 configured to receive an input signal (e.g., input signal $V_{IN}$) and based on one or more characteristics of the input signal, control the impedance of variable output impedance 50. In some embodiments, output impedance controller 32 together with variable output impedance 50A may operate in a plurality of output impedance modes including a high output impedance mode and a low output impedance mode of the closed-loop analog pulse width modulator. In such embodiments, when switching from the high output impedance mode to the low output impedance mode (e.g., in response to the input signal increasing from below a threshold magnitude to above the threshold magnitude), control subsystem 30A may control bypass switch 58 to activate (e.g., close, turn on, be enabled) thus bypassing impedance element 56, and when switching from the low output impedance mode to the high output impedance mode (e.g., in response to the input signal decreasing from above a threshold magnitude to below the threshold magnitude), control subsystem 30A may control bypass switch 58 to deactivate (e.g., open, turn off, be disabled) such that the impedance of impedance element 56 appears between the output of analog PWM subsystem 26 and the output of PWM amplifier 22A.

Output impedance controller 32 may also be configured to receive an input signal (e.g., input signal $V_{IN}$) and based on one or more characteristics of the input signal, selectively activate and deactivate ground switch 60.

Figure 5:
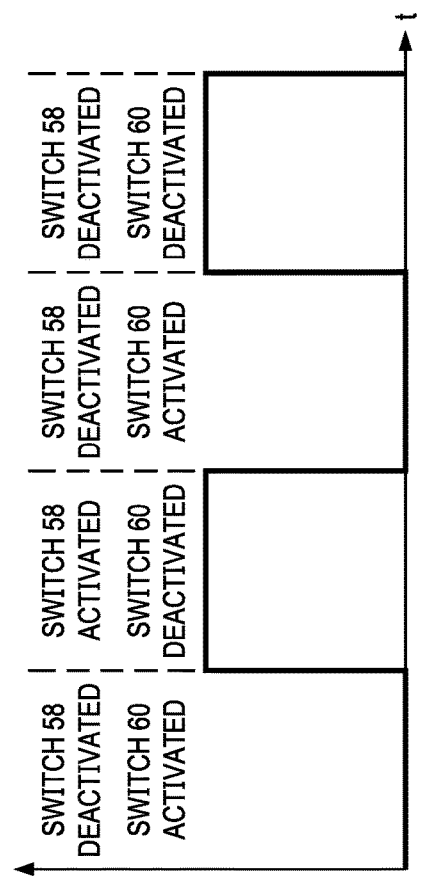
FIG. 5 is an example graph of a pulse width modulation signal versus time, in accordance with embodiments of the present disclosure.

In some embodiments, output impedance controller 32 may selectively activate and deactivate bypass switch 58 and ground switch 60 as a function of a PWM signal received at an input of closed-loop analog PWM subsystem 26. For example, as shown in FIG. 5, which depicts a PWM signal received by analog PWM subsystem 26 as a function of time, bypass switch 58 may be activated and ground switch 60 may be deactivated when the PWM signal is asserted, and bypass switch 58 may be deactivated and ground switch 60 may be activated when the PWM signal is deasserted.

For purposes of clarity of exposition, the output of PWM amplifiers 22 and 22A are shown as a single-ended load with output voltage $V_{OUT}$ being a single-ended voltage. However, in some embodiments, a PWM amplifier 22 or 22A may be implemented with a differential voltage output, such that one driver stage 34 drives a first terminal of an output load and another driver stage 34 drives a second terminal of the output load.

Although the foregoing contemplates use of PWM amplifiers 22 and 22A for use in an audio amplifier for driving an audio transducer, it is understood that PWM amplifiers 22 and 22A may be used in other types of amplifiers for driving other types of transducers, including without limitation an amplifier for driving a haptic transducer.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An apparatus, comprising:
   a signal path comprising a closed-loop analog pulse width modulator having a forward signal path and a feedback path and comprising a driver stage configured to drive an output voltage to an output of the apparatus;

a variable resistor coupled between the driver stage of the closed-loop analog pulse width modulator and the output of the apparatus, such that the driver stage drives the output of the apparatus through the variable resistor; and a control circuit outside of the forward signal path and configured to modify the variable resistor in order to modify an output impedance outside of the feedback path of the closed-loop analog pulse width modulator responsive to a condition occurring within the signal path for switching between a high output impedance mode and a low output impedance mode of the closed-loop analog pulse width modulator or vice versa.

2. The apparatus of claim 1, wherein the variable resistor comprises a string of resistor elements in series with one another and a plurality of switches configured to, under control of the control circuit, control a first amount of impedance of the variable resistor within the feedback path and control a second amount of impedance of the variable resistor outside of the feedback path.

3. The apparatus of claim 2, wherein the control circuit is further configured to:
when switching from the high output impedance mode to the low output impedance mode, increase the first amount of impedance and decrease the second amount of impedance; and
when switching from the low output impedance mode to the high output impedance mode, decrease the first amount of impedance and increase the second amount of impedance.

4. The apparatus of claim 2, wherein the signal path further comprises a gain element and the control circuit is further configured to vary a gain of the gain element when switching from the high output impedance mode to the low output impedance mode or vice versa such that an overall path gain of the signal path remains substantially constant as a result of the switching.

5. The apparatus of claim 4, wherein the gain element is an analog gain element.

6. The apparatus of claim 4, wherein the gain element is a digital gain element.

7. The apparatus of claim 4, further comprising a calibration circuit configured to calibrate the gain element during one of the following:
at product test of the apparatus prior to end use of the apparatus; and
during real-time operation of the apparatus during end use, wherein the calibration circuit comprises a calibration loop located on an integrated circuit including the signal path.

8. The apparatus of claim 7, wherein during real-time operation of the apparatus during end use, the calibration circuit is configured to calibrate the gain element to compensate for variations of the apparatus due to temperature.

9. The apparatus of claim 1, wherein the variable resistor comprises an impedance element in parallel with a bypass switch configured to, under control of the control circuit, activate to bypass the impedance element in the low output impedance mode, and deactivate in the high output impedance mode.

10. The apparatus of claim 9, further comprising a ground switch coupled between a terminal of a voltage supply of the apparatus and a first terminal of the impedance element, wherein a second terminal of the impedance element is coupled at the output of the closed-loop analog pulse width modulator.

11. The apparatus of claim 10, wherein the bypass switch and the ground switch are selectively activated and deactivated as a function of a pulse width modulation signal received at an input of the closed-loop analog pulse width modulator.

12. The apparatus of claim 11, wherein:
the bypass switch is activated and the ground switch is deactivated when the pulse width modulation signal is asserted; and
the bypass switch is deactivated and the ground switch is activated when the pulse width modulation signal is deasserted.

13. A method comprising, in a system comprising a signal path comprising a closed-loop analog pulse width modulator having a forward signal path and a feedback path and comprising a driver stage configured to drive an output voltage to an output of the system, and further having a variable resistor coupled between the driver stage of the closed-loop analog pulse width modulator and the output of the system, such that the driver stage drives the output of the system through the variable resistor:
modifying, with a control circuit outside of the forward signal path, the variable resistor in order to modify an output impedance outside of the feedback path of the closed-loop analog pulse width modulator responsive to a condition occurring within the signal path for switching between a high output impedance mode and a low output impedance mode of the closed-loop analog pulse width modulator or vice versa.

14. The method of claim 13, wherein:
the variable resistor comprises a string of resistor elements in series with one another and a plurality of switches; and
the method further comprises controlling by the plurality of switches a first amount of impedance of the variable resistor within the feedback path and control a second amount of impedance of the variable resistor outside of the feedback path.

15. The method of claim 13, further comprising:
when switching from the high output impedance mode to the low output impedance mode, increasing the first amount of impedance and decreasing the second amount of impedance; and
when switching from the low output impedance mode to the high output impedance mode, decreasing the first amount of impedance and increasing the second amount of impedance.

16. The method of claim 15, wherein:
the signal path further comprises a gain element; and
the method further comprises varying a gain of the gain element when switching from the high output impedance mode to the low output impedance mode or vice versa such that an overall path gain of the signal path remains substantially constant as a result of the switching.

17. The method of claim 16, wherein the gain element is an analog gain element.

18. The method of claim 16, wherein the gain element is a digital gain element.

19. The method of claim 16, further comprising calibrating the gain element during one of the following:
at product test of the apparatus prior to end use of the system; and
during real-time operation of the apparatus during end use, wherein the calibration circuit comprises a calibration loop located on an integrated circuit including the signal path.

20. The method of claim 19, wherein during real-time operation of the apparatus during end use, the calibrating of the gain element compensates for variations of the system due to temperature.

21. The method of claim 13, wherein:
   the variable resistor comprises an impedance element in parallel with a bypass switch; and
   the method further comprises activating the bypass switch to bypass the impedance element in the low output impedance mode and deactivate in the high output impedance mode.

22. The method of claim 21, wherein the system comprises a ground switch coupled between a terminal of a voltage supply of the apparatus and a first terminal of the impedance element, wherein a second terminal of the impedance element is coupled at the output of the closed-loop analog pulse width modulator.

23. The method of claim 22, further comprising selectively activating and deactivating the bypass switch and the ground switch as a function of a pulse width modulation signal received at an input of the closed-loop analog pulse width modulator.

24. The method of claim 23, further comprising:
   activating the bypass switch and deactivating the ground switch when the pulse width modulation signal is asserted; and
   deactivating the bypass switch and activating the ground switch when the pulse width modulation signal is deasserted.

* * * * *